(12) United States Patent
Naya et al.

(10) Patent No.: US 6,344,367 B1
(45) Date of Patent: Feb. 5, 2002

(54) METHOD OF FABRICATING A DIFFRACTION GRATING

(75) Inventors: Masayuki Naya; Toshiaki Fukunaga, both of Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/612,906

(22) Filed: Jul. 10, 2000

(30) Foreign Application Priority Data

Jul. 8, 1999 (JP) .......................................... 11-194056

(51) Int. Cl.$^7$ ............................................... H01L 21/00
(52) U.S. Cl. ....................................................... 438/32
(58) Field of Search ........................... 438/29, 32, 942, 438/945, 947; 372/102; 385/10, 37, 130

(56) References Cited

U.S. PATENT DOCUMENTS 5,225,039 A * 7/1993 Ohguri

FOREIGN PATENT DOCUMENTS

JP 6-148413 * 5/1994 ............ G02B/5/18

* cited by examiner

*Primary Examiner*—Keith Christianson
(74) *Attorney, Agent, or Firm*—Sughrue Mion, PLLC

(57) ABSTRACT

A first resist layer (21) and a second resist layer (22) are formed on a base material (11) in the recited order, the first resist layer (21) being removable by etching and the second resist layer (22) being a photosensitive resist layer in which either exposed or unexposed regions become soluble in a developing solvent upon emission of light. Near-field light is then emitted to the second resist layer (22) by means (24) for emitting near-field light (27) according to a diffraction grating pattern upon reception of the light. Next, the diffraction grating pattern is formed in the second resist layer (22) by developing the second resist layer (22). The first resist layer (21) is etched with the pattern in the second resist layer (22) as an etching mask, and a diffraction grating pattern consisting of the first and second resist layers (21, 22) is formed. Finally, a diffraction grating is formed in the base material (11) by etching the base material (11) with the pattern in the first and second resist layers (21, 22) as an etching mask.

50 Claims, 11 Drawing Sheets

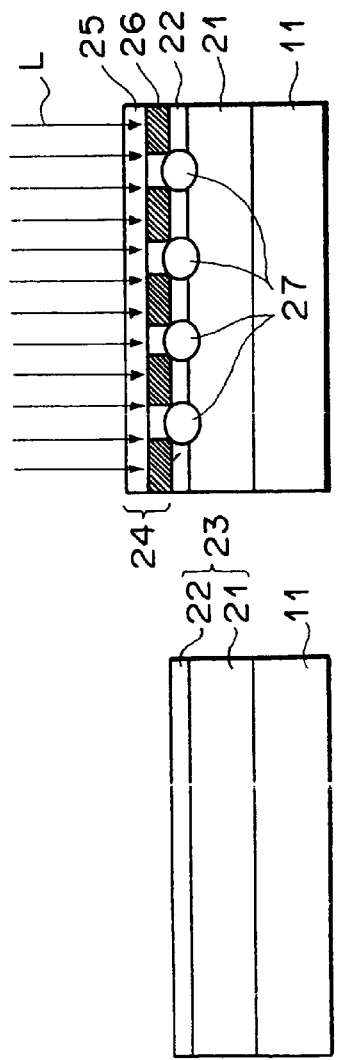
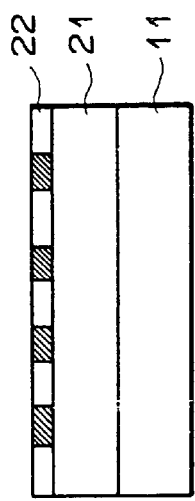
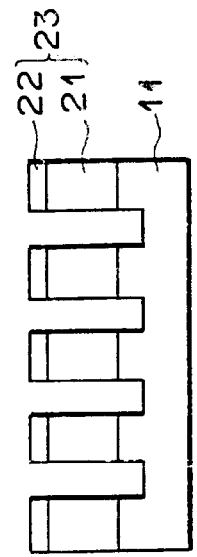
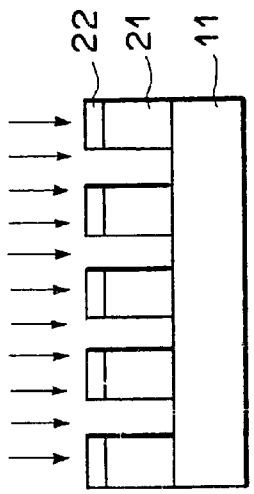
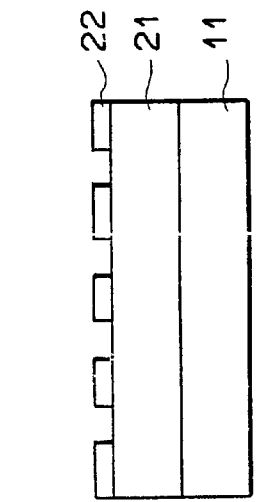
FIG.1A  FIG.1B  FIG.1C
FIG.1D  FIG.1E  FIG.1F

METHOD OF FABRICATING A DIFFRACTION GRATING

BACKGROUND OF THE INVENTION

1. Field of the Invention

The present invention relates to a method of fabricating a diffraction grating, and more particularly to a method of fabricating an extremely fine diffraction grating on a base material by optical lithography employing near-field light.

2. Description of the Related Art

Semiconductor laser types in which a diffraction grating is formed on a region along an active layer to select and stabilize an oscillating frequency, such as distributed Bragg reflector (DBR) lasers, distributed feedback (DFB) lasers and the like, have hitherto been provided in a variety of ways. Recently, in this type of semiconductor layer, a demand for shortening of the oscillating wavelength is becoming increasingly strong from the standpoint of realizing a blue light source, etc. To meet this demand for a shorter wavelength, a technique for fabricating a diffraction grating with a micro-cycle, as well as selection of semiconductor materials, becomes indispensable.

If this diffraction grating is made into a higher-order diffraction grating, the cycle becomes relatively large and consequently the processing also becomes easy. However, in the higher-order diffraction grating there is a reduction in the feedback light quantity due to spatially diffracted light, and on top of that, there is a need to control the line-and-space ratio with a high degree of accuracy. Therefore, in many cases a first-order diffraction grating is preferred. In the case of a first-order diffraction grating, the linewidth of the grating pattern on the order of 100 nm or less is required.

In widely used methods for fabricating a fine diffraction grating, two-beam interference exposure has been applied to photolithography to form a fine diffraction grating pattern, as shown in Japanese Unexamined Patent Publication No. 6(1994)-148413, for example.

However, since in optical lithography the diffraction limit of light becomes the limit of resolution, it has been said that a linewidth of 100 nm (in terms of a diffraction grating cycle, 200 mm) is the limit of fining, even if an $F_2$ eximer laser of wavelength 248 nm is employed. Furthermore, if resolution in the order of a nanometer greater than 100 nm is to be obtained, electron beam lithography or X-ray (particularly, synchrotron radiation) lithography must be employed.

The e-beam lithography has the following advantages: basically a pattern in the order of a nanometer can be controlled and formed with a high degree of accuracy; the focal depth is considerably deep compared with optical systems; and direct wafer exposure (i.e., exposure of the resist directly by focused electron beam without a mask) is possible. However, the e-beam lithography has the drawback that it is still far from mass production, because the throughput is low and it requires expensive devices that cause an increased cost. This e-beam lithography also has the problem that it is difficult to maintain a uniform linewidth with respect to a wide area, as it employs scanning exposure.

The X-ray lithography is capable of enhancing resolution and precision by a factor of 10, compared with eximer laser exposure, even when 1:1 mask exposure is performed and even when a reflection-type image-forming X-ray optics system is employed. However, the X-ray lithography is difficult to realize because mask fabrication is difficult, and also has the problem that fabrication costs are high.

In the lithography employing an X-ray or e-beam, there is a need to develop specialized resists in accordance with the exposure methods, and there are still many problems associated with sensitivity, resolution, resistance to etching, etc.

SUMMARY OF THE INVENTION

The present invention has been made in view of the aforementioned problems. Accordingly, it is an object of the present invention to provide a method that is capable of inexpensively fabricating a diffraction grating with an extremely fine cycle. Another object of the invention is to provide a method which is capable of fabricating the aforementioned diffraction gratings in high throughput, while maintaining a uniform linewidth with respect to a wide area.

To achieve the aforementioned objects and in accordance with one aspect of the present invention, there is provided a diffraction-grating fabricating method comprising the steps of:

forming a photosensitive resist layer on a base material, either exposed or unexposed regions of the resist layer by emission of light becoming soluble in a developing solvent;

emitting near-field light to the resist layer by means for emitting near-field light according to a diffraction grating pattern upon reception of the light;

forming the diffraction grating pattern in the resist layer by developing the resist layer; and forming a diffraction grating in the base material by etching the base material with the pattern in the resist layer as an etching mask.

In accordance with another aspect of the present invention, there is provided a diffraction-grating fabricating method comprising the steps of:

forming a first resist layer and a second resist layer on a base material in the recited order, the first resist layer being removable by etching and the second resist layer being a photosensitive resist layer in which regions either exposed or unexposed to emission of light become soluble in a developing solvent;

emitting near-field light to the second resist layer by means for emitting near-field light according to a diffraction grating pattern upon reception of the light;

forming the diffraction grating pattern in the second resist layer by developing the second resist layer;

etching the first resist layer with the pattern in the second resist layer as an etching mask and forming a diffraction grating pattern consisting of the first and second resist layers; and forming a diffraction grating in the base material by etching the base material with the pattern in the first and second resist layers as an etching mask.

In a preferred form of the present invention, the second resist layer is formed to a thickness of 100 nm or less. On the other hand, the first resist layer is formed from non-photosensitive material and the step of etching the first resist layer is performed by dry etching.

In another preferred form of the present invention, the light has a wavelength of 250 to 450 nm and the diffraction grating has a cycle of 400 nm or less. Also, the diffraction grating is rectangular in cross section and the line-and-space ratio is between 1.2:1 and 1:1.2.

In still another preferred form of the present invention, the means for emitting near-field light is a mask, formed above a member permeable to the light, which emits the near-field light from a metal pattern having openings. In that case it is desirable that the light emission be performed with the metal pattern disposed in direct contact with the exposed resist layer formed on the base material, or in close proximity to the exposed resist layer in a range where the near-field light reaches the exposed resist layer. Also, the means for emitting near-field light may be an optical stamp formed from a member permeable to the light, a land-and-groove pattern being formed on one surface of the member and the optical stamp emitting near-field light according to the land-and-groove pattern when the light is guided through the inside of the member to the one surface and totally reflected at the one surface. In that case, it is also desirable that the light emission be performed with the optical stamp disposed in direct contact with the exposed resist layer formed on the base material, or in close proximity to the exposed resist layer in a range where the near-field light reaches the exposed resist layer.

In a further preferred form of the present invention, the means for emitting near-field light is a probe with an opening of smaller diameter than a wavelength of the light, and the light emission is performed by scanning the probe on the exposed resist layer formed on the base material.

The diffraction-grating fabricating method of the present invention mentioned above is extremely efficient when applied in fabricating a diffraction grating for a distributed feedback (DFB) laser or distributed Bragg reflector (DBR) laser.

According to the diffraction-grating fabricating method of the present invention, a diffraction grating of linewidth 100 nm or less, i.e., cycle 200 nm or less, which cannot be obtained by conventional photolithography, can be formed by exposing a resist layer to near-field light oozing out from a pattern of sufficiently smaller linewidth than the wavelength of light to be emitted and developing the exposed resist layer.

Hence, if such a diffraction-grating fabricating method is applied for fabricating a diffraction grating for a DFB or DBR laser, a DFB or DBR laser which oscillates in a short wavelength region less than a blue light region can be realized.

While resolution in conventional lithography is determined primarily by the wavelength of a light source, in the diffraction-grating fabricating method of the present invention the wavelength of the light source for emitting near-field light can be any wavelength. Therefore, there is no need to develop a novel light source and the fabricating costs for a diffraction grating can be considerably reduced.

In addition, in the aforementioned method employing the two-layer resist consisting of first and second resist layers, even in the case where there is a level difference in the base material and there are those portions of the first resist layer which near-field light does not reach, the second photosensitive resist layer on the first resist layer can be made uniform in thickness because a surface is planarized by the first resist layer. Hence, even a large-area pattern can be illuminated uniformly with near-field light and a minute pattern can be formed in the second resist layer. By patterning the first resist layer and the base material by a conventional etching method, with the pattern in the second resist layer as a mask, a fine pattern with a high aspect ratio can be easily formed at low cost.

Furthermore, in the case where the aforementioned mask with a metal pattern or the optical stamp with a land-and-groove pattern is employed as the means for emitting near-field light, a diffraction grating pattern with a large area can be exposed at once, unlike the case of scanning exposure and therefore diffraction gratings can be fabricated inexpensively and with high throughput.

BRIEF DESCRIPTION OF THE DRAWINGS

The above and other objects and advantages will become apparent from the following detailed description when read in conjunction with the accompanying drawings wherein:

FIGS. 1A to F are schematic diagrams used for explaining the steps of a method of fabricating a diffraction grating according to a first embodiment of the present invention;

DESCRIPTION OF THE PREFERRED EMBODIMENTS

The preferred embodiments of the present invention will hereinafter be described in detail with reference to the drawings.

First, the fabrication of a distributed feedback (DFB) laser according to a first embodiment of the present invention will be described with reference to FIGS. 2 to 6. In the first embodiment, trimethylgallium (TMG), trimethylindium (TMI), and ammonia are used as materials for growth, a silane gas is used as an n-type dopant gas, and cyclopentadienylmagnesium ($Cp_2Mg$) is used as a p-type dopant gas.

Figure 2:
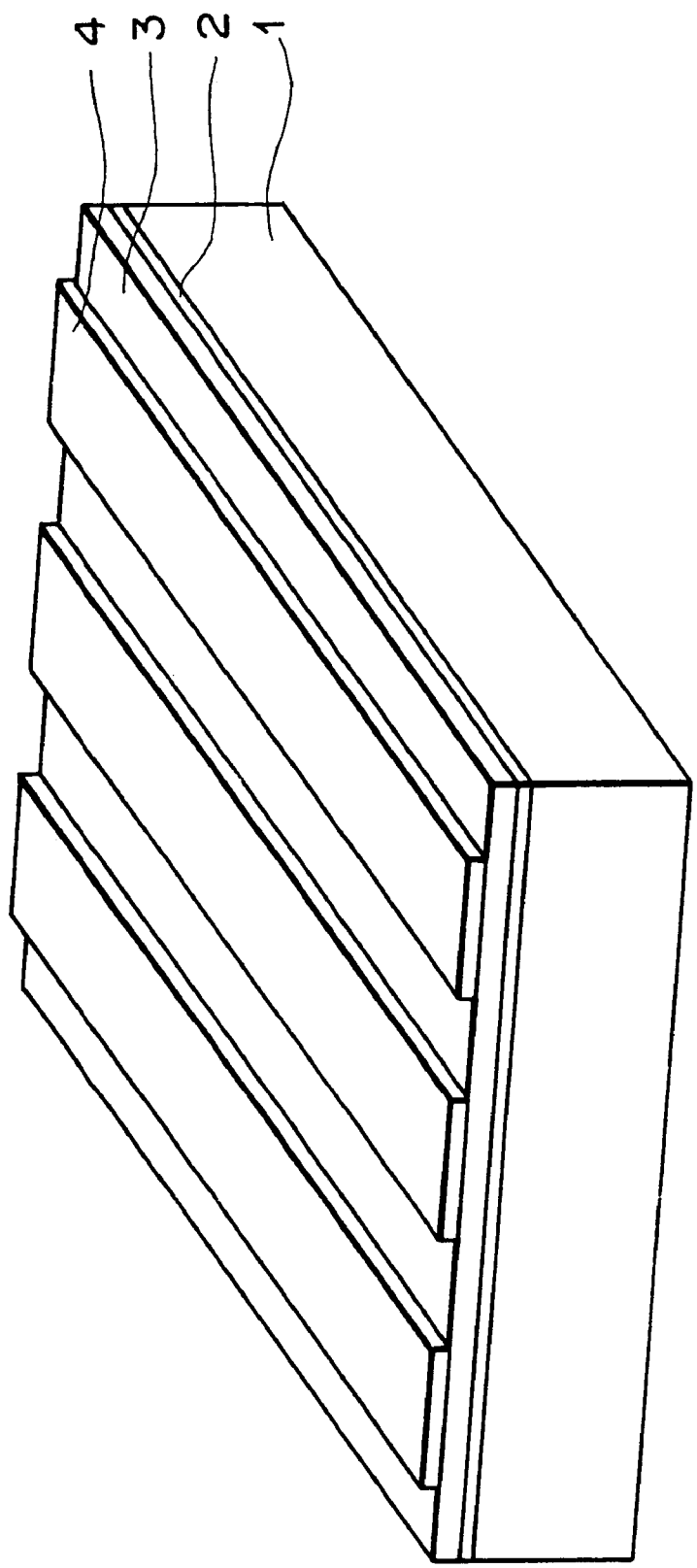
FIGS. 2 to 5 are perspective views showing how a DFB laser is fabricated by the method shown in FIG. 1.

As illustrated in FIG. 2, a GaN buffer layer 2 is formed to a thickness of about 20 nm at 500° C. on the (0001)-C plane of a sapphire substrate 1 by an organic-metal vapor-phase growth method. A GaN layer 3 is then grown to a thickness of about 2 $\mu$m at 1050° C. Next, a $SiO_2$ layer is formed, and with ordinary lithography, a $SiO_2$ mask 4 which consists of a line-and-space pattern having stripe windows 3 $\mu$m in width extending in the <1100>-direction is formed. The cycle of a line and a space is about 10 $\mu$m.

Figure 3:
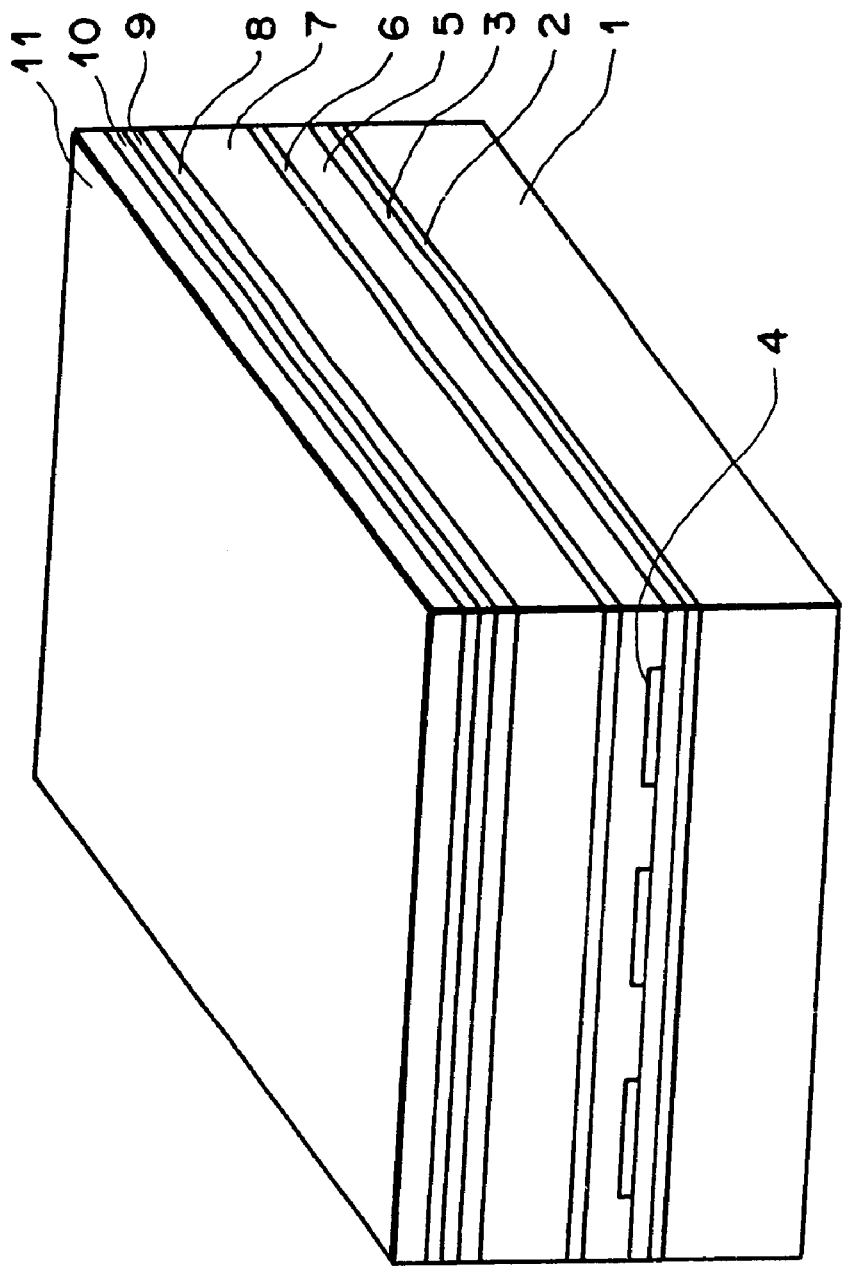

Thereafter, as shown in FIG. 3, a Si-doped GaN layer 5 is grown to a thickness of about 20 $\mu$m at 1050° C. When this occurs, the lateral growth causes the stripes in the mask 4 to be combined with the Si-doped GaN layer 5, and the surface is planarized. Then, a Si-doped $In_{x2}Ga_{1-x2}N$ anti-crack layer 6 is grown to a thickness of about 0.1 $\mu$m, and an $Al_{z2}Ga_{1-z2}$(2.5 nm)/Si-doped GaN(2.5 nm) superlattice clad layer 7, which consists of 240 layers, is formed. Furthermore, a Si-doped GaN optical waveguide layer 8, an $In_{x3}Ga_{1-x3}N$(5 nm)/$In_{x4}Ga_{1-x4}N$(2.5 nm) multi-quantum well active layer 9, a Mg-doped $Al_{z3}Ga_{1-z3}$(2.5 nm) carrier block layer 10, and a Mg-doped GaN optical waveguide layer 11 are formed in the recited order.

Figure 4:
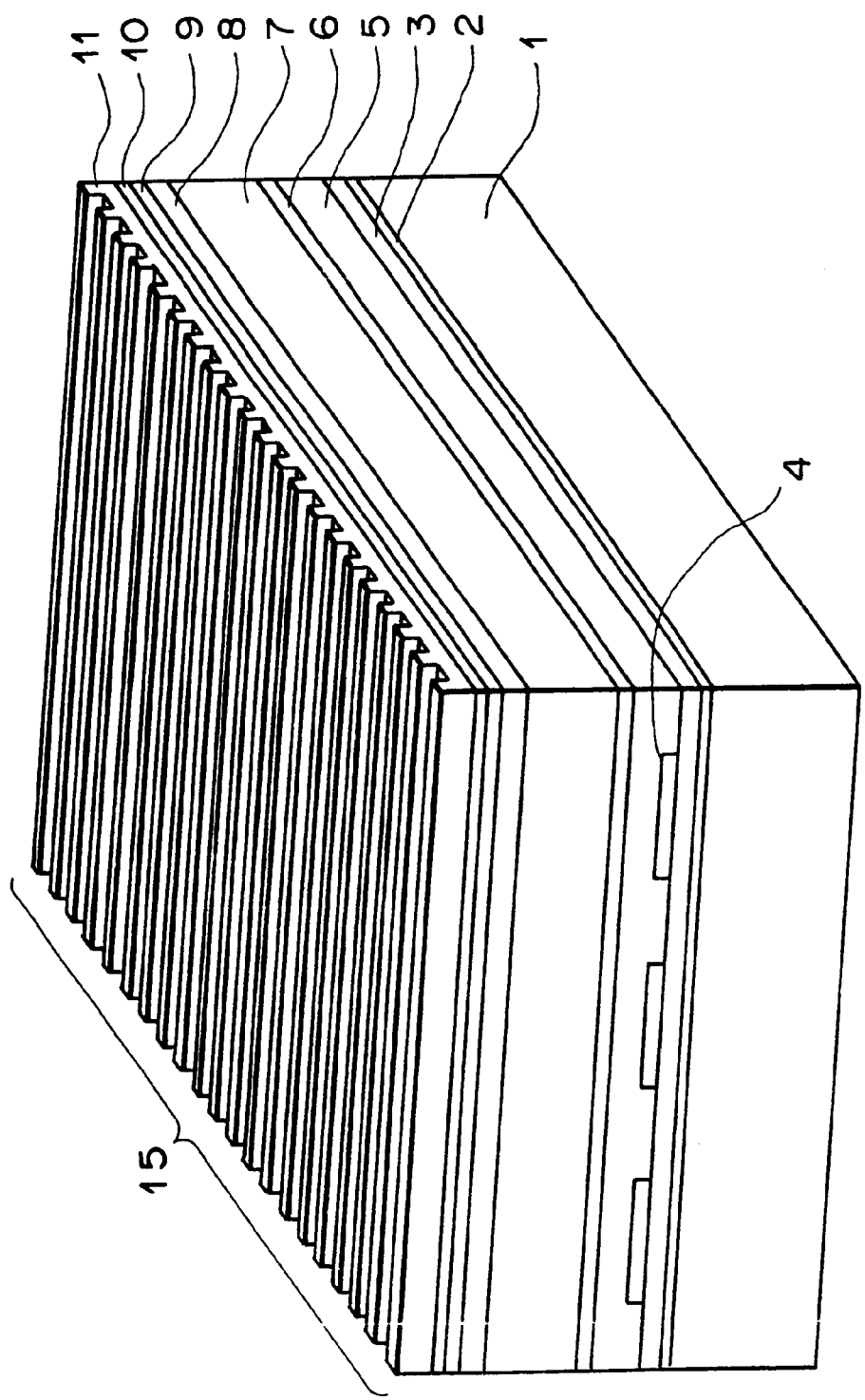

Thereafter, according to the first embodiment of the present invention, a diffraction grating 15 with each grating portion extending in a direction perpendicular to the <1100>-direction is formed on the surface of the GaN optical waveguide layer 11, as shown in FIG. 4. Assuming the diffraction grating 15 is a first-order diffraction grating, the cycle Λ is expressed as Λ=λ/2n where λ is the oscillating wavelength and n is the equivalent refractive index of the waveguide. Although a method of fabricating this diffraction grating 15 will be described later, the grooves in the grating 15 are formed by ordinary dry etching and the groove depth is about 10 to 40 nm.

Figure 5:
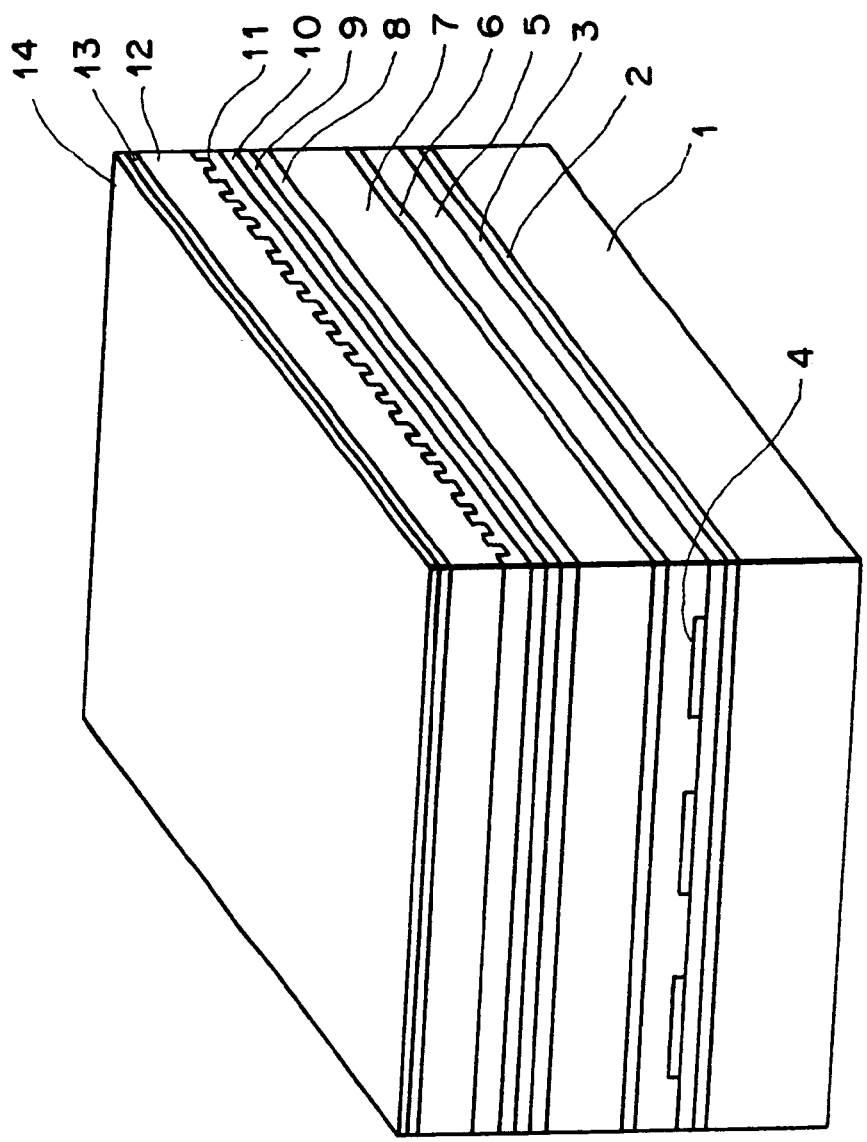

Subsequently, as shown in FIG. 5, an $Al_{z2}Ga_{1-z2}$(2.5 nm)/Si-doped GaN(2.5 nm) superlattice clad layer 12 and a Mg-doped GaN contact layer 13 are formed on the GaN optical waveguide layer 11 on which the diffraction grating 15 was formed. Here, to activate a p-type impurity Mg, either a method of performing a thermal process in the ambience of $O_2$ after growth of each layer or a method of growing each layer in the rich ambience of $N_2$ is applied. Note that the aforementioned composition becomes $0 \leq z2 < z3 \leq 0.2$ when $0 < x3 < x2 < x4 \leq 0.3$.

Figure 6:
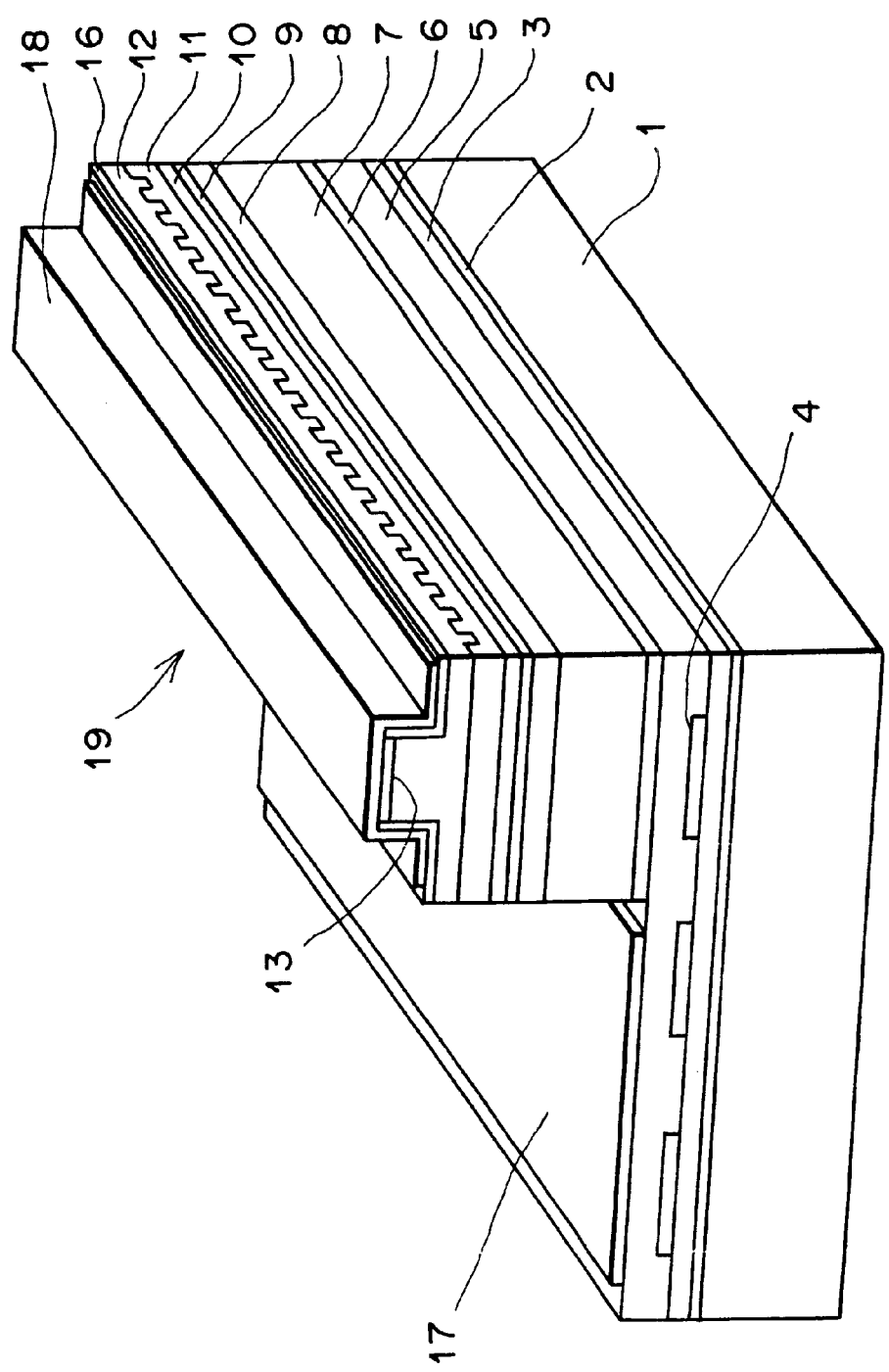
FIG. 6 is a perspective view showing the DFB laser formed by the method shown in FIG. 1.

Furthermore, a $SiO_2$ film 14 is formed on the contact layer 13, and with ordinary lithography, the $SiO_2$ film 14 is removed, leaving behind those portions of the $SiO_2$ film 14 that correspond to the stripe regions having a width of about 2 μm. Then, reactive ion etching (RIE) is performed up to anywhere in the superlattice clad layer 12 so that a ridge portion 19 such as that shown in FIG. 6 is formed. The thickness of the clad layer 12 in this selective etching is reduced to a thickness such that basic lateral mode oscillation can be achieved. Next, the $SiO_2$ film 14 for the stripe regions are also removed.

Subsequently, a $SiO_2$ film (not shown) is formed, the $SiO_2$ film other than regions 100 μm outside of the stripe is removed, and RIE is performed until the Si-doped GaN layer 5 is exposed. Then, an insulating film 16 such as the one shown in FIG. 6 is formed by ordinary lithography. On the other hand, an n electrode 17 composed of Ti/Au is formed on the surface of the exposed Si-doped GaN layer 5, and a p electrode 18, composed of Ni/Al, which extends in the form of a stripe, is formed on the surface of the GaN contact layer 13.

Thereafter, the substrate 1 is polished, a high reflective coat and a nonreflective coat are applied to resonator surfaces formed by cleaving the sample, and it is cut into DFB laser chips.

In the DFB laser formed in the aforementioned manner, the oscillating wavelength λ can be controlled in a range of 400 nm<λ<500 nm by varying the indium composition of the active layer 9. Also, the conductivity in the first embodiment may be inverted (i.e., n-type and p-type may be interchanged).

While the first embodiment employs the sapphire substrate, DFB lasers can be formed in a like manner, even if other substrates, such as Sic, ZnO, $LiGaO_2$, $LiAlO_2$, ZnSe, GaAs, GaP, Ge, and Si substrates, are employed.

Figure 7:
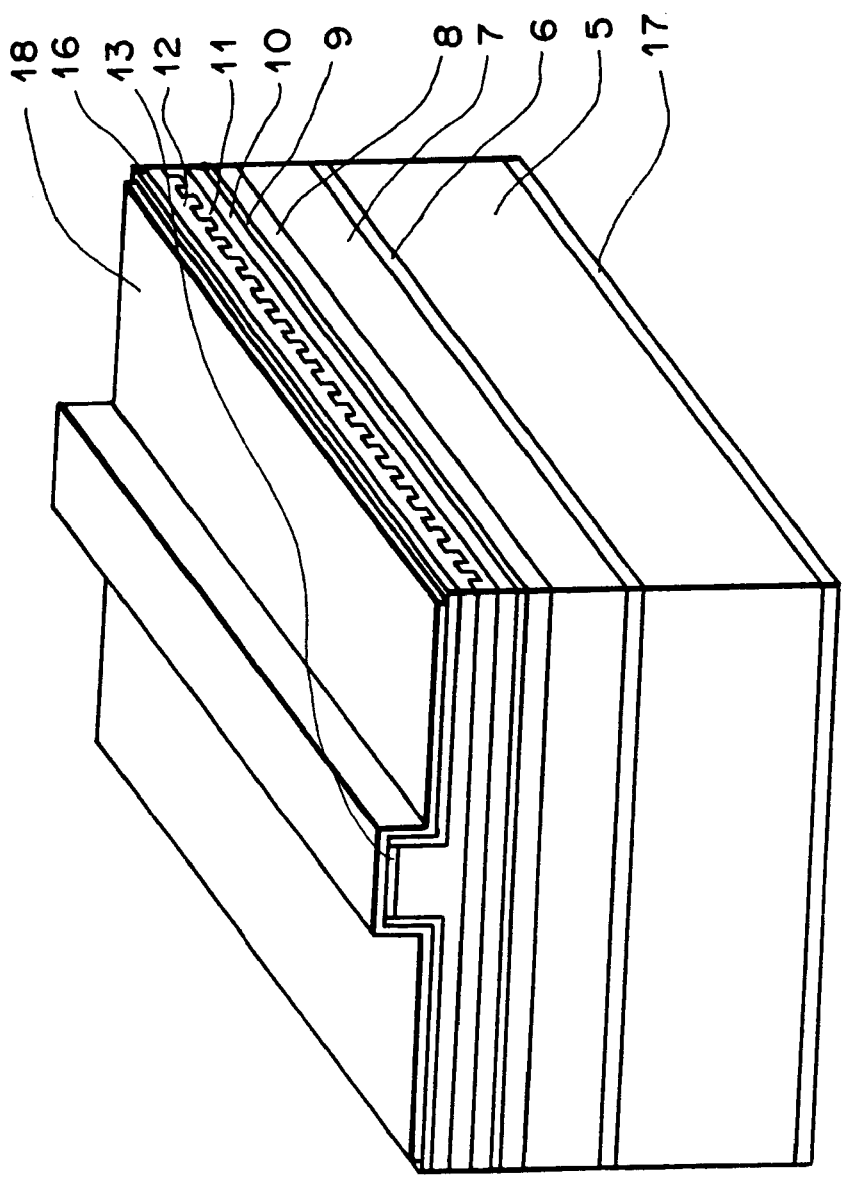
FIG. 7 is a perspective view showing another DFB laser formed according to another diffraction-grating fabricating method of the present invention.

In addition, as shown in FIG. 7, by growing the GaN layer 5 to a thickness of about 200 μm and removing the substrate by etching or polishing so that the GaN layer 5 is exposed, the n electrode 17 which, in the first embodiment, is formed on the upper surface GaN layer 5 can also be formed on the lower surface of the GaN layer 5 used as a substrate.

Now, a method of fabricating the diffraction grating 15 will be described with reference to FIG. 1. As shown in FIG. 1A, a first resist layer 21 consisting of an organic polymer and a second resist layer 22 consisting of a photosensitive material are sequentially formed on the GaN optical waveguide layer 11 which is a base material for fabricating a diffraction grating, by a spinning or spraying method. As a result, a two-layer resist 23 is formed. Note that in FIG. 1, the illustration of layers formed under the GaN optical waveguide layer 11 has been omitted.

After formation of the two-layer resist 23, a mask 24 for emitting near-field light according to a diffraction grating pattern is brought into direct contact with the two-layer resist 23, as shown in FIG. 1B. This mask 24 is constituted by a mask substrate 25, which consists of a dielectric such as glass, and a grating-shaped metal pattern 26 formed on the mask substrate 25. The metal pattern 26 has a plurality of micro-openings. As is clear from the following description, each metal portion of the metal pattern 26 corresponds to each grating portion of a diffraction grating to be fabricated, while each opening corresponds to the space between the grating portions. Next, if exposure light L, such as i-rays (of wavelength 365 nm), is emitted to the rear side of the mask, i.e., to the side of the mask substrate 25, near-field light 27 is emitted from the openings of the metal pattern 26 and the second resist layer 22 is exposed to this near-field light 27.

Figure 8A:
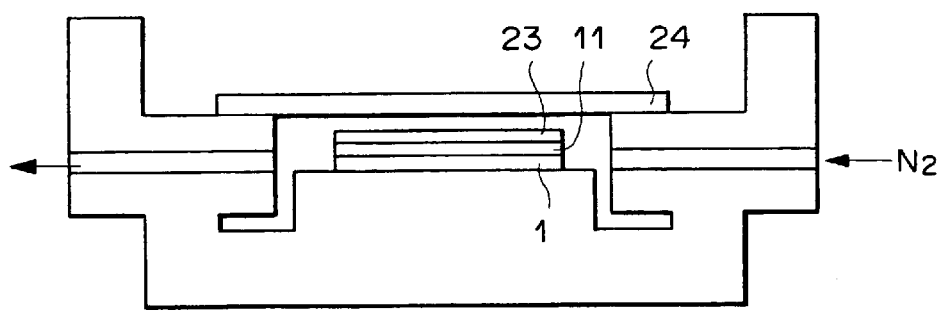
FIGS. 8A to C are sectional views showing a direct exposure tool used in the method explained in FIG. 1.

Here, the aforementioned direct exposure method in this embodiment will be described in further detail with reference to a cross sectional view in FIG. 8 showing a direct-exposure tool making use of vacuum suction. As shown in FIG. 8A, the substrate 1 with the two-layer resist 23 formed on the GaN optical waveguide layer 11 is held on the exposure tool and the mask 24 is held in close proximity to the substrate 1. Before exposure, an inert gas such as $N_2$ gas constantly flows through the space between the mask 24 and the two-layer resist 23.

Figure 8B:
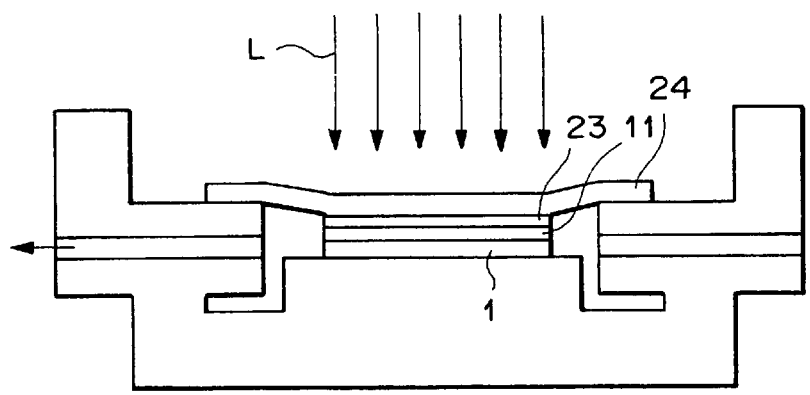
Figure 8C:
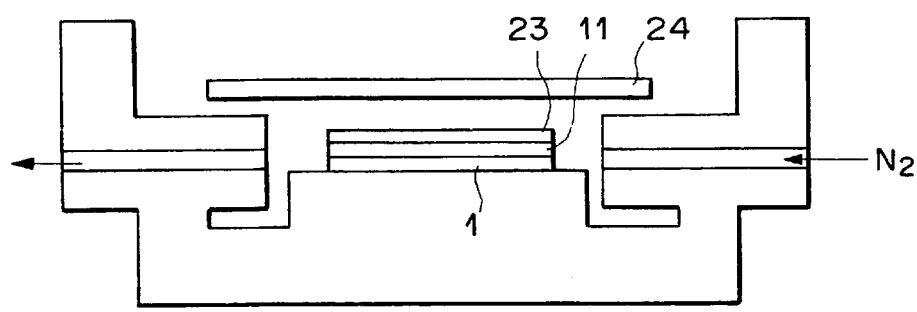

During exposure, as shown in FIG. 8B, the space between the mask 24 and the two-layer resist 23 is evacuated and the mask 24 is brought into direct contact with the two-layer resist 23 (more specifically, with the second resist layer 22). In this condition, exposure light L is emitted to the rear of the mask 24 as described above. If the $N_2$ gas within the exposure tool is again purged after completion of this exposure, the mask 24 is spaced from the two-layer resist 23 as shown in FIG. 8C.

As shown in FIG. 1D, the second resist layer 22 is dissolved in a developing solution, the exposed regions become soluble in the developing solvent, and the diffraction grating pattern is formed in the positive resist. As shown in FIG. 1E, with the pattern in the second resist layer 22 as a mask, the exposed regions of the first resist layer 21 are removed by a dry etching process employing $O_2$-containing plasma. As a result, a fine diffraction pattern with a high aspect ratio is formed. Note that instead of using the above-mentioned dry etching, ion dry etching or gas etching can be applied.

After the GaN optical waveguide layer 11 has been etched with the diffraction grating pattern in the first and second resist layers 21 and 22 as a mask, both the resist layers 21 and 22 are lifted off and removed. As a result, the diffraction grating 15 is formed on the GaN optical waveguide layer 11, as shown in FIG. 4.

Since there is no possibility that the first resist layer 21 will change in quality because of exposure, both the resist layers 21 and 22 can be easily removed by dissolution of the first resist layer 21. They can also be peeled off by plasma ashing.

Note that the photoresist constituting the second resist layer 22 may be a negative resist in which only the exposed regions become insoluble in a developing solvent. Also, it is desirable that the thickness of the second resist layer 22 be less than or equal to the depth that near-field light is emitted.

In addition, the organic polymer material of the first resist layer 21 may be of any type if it can be etched by $O_2$-containing plasma. However, an aromatic polymer is preferred because it has resistance to plasma when used as a mask to etch the base material after pattern formation.

Figure 9:
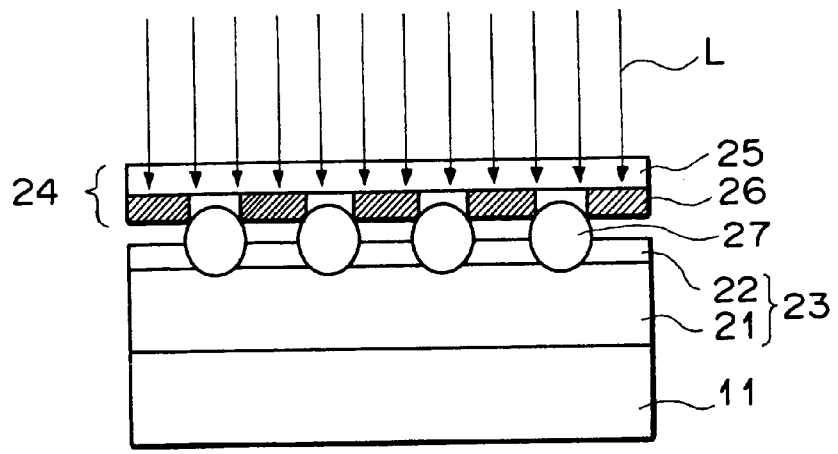
FIG. 9 is a sectional view showing the condition of near-field light in a second embodiment of the present invention.

FIG. 9 illustrates a second embodiment of the present invention. Note that all the embodiments to be described below differ from the first embodiment in exposure method and resist layer construction, and for development after this exposure, the etching step, etc., in the first embodiment, for example, can be applied as they are. Also, in FIG. 9, the same reference numerals are applied to the same parts as those in FIG. 1 and a description thereof is omitted to avoid redundancy (the same applies to the following description).

While, in the first embodiment, direct exposure has been performed, this second embodiment performs proximity exposure in which exposure is performed with the mask 24 disposed in close proximity to the two-layer resist 23 in a range where near-field light reaches the two-layer resist 23. In this proximity exposure, the problem of damage to the mask 24, damage to the substrate 1, dust adhesion to the substrate 1, etc., which becomes a problem in the case of direct exposure, is solved and throughput is enhanced.

Figure 10:
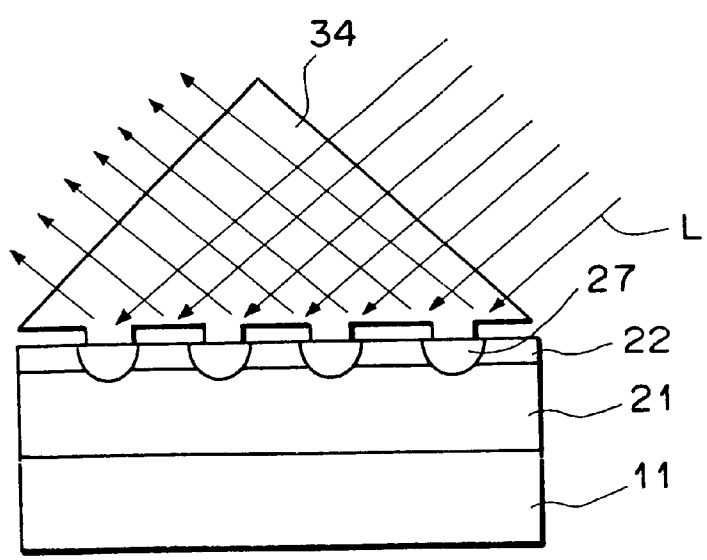
FIG. 10 is a sectional view showing the condition of near-field light in a third embodiment of the present invention.

FIG. 10 illustrates a third embodiment of the present invention. This third embodiment employs an optical stamp 34 that emits near-field light 27 from a land-and-groove pattern formed on one surface (lower surface in FIG. 10). As shown, if this optical stamp 34 is brought into direct contact with the second resist layer 22 and exposure light L is introduced into the optical stamp 34 and totally reflected at the above-mentioned one surface, the second resist layer 22 can be exposed to the near-field light 27 which occurs from the land portions of the land-and-groove pattern.

This type of optical stamp has the advantage that it can be fabricated at low costs, because it does not employ metal as does the mask 24.

Figure 11:
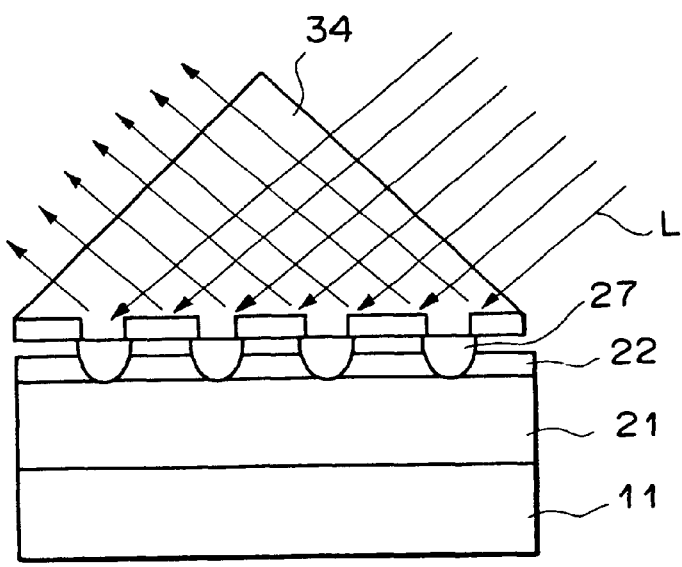
FIG. 11 is a sectional view showing the condition of near-field light in a fourth embodiment of the present invention.

FIG. 11 illustrates a fourth embodiment of the present invention. As shown in this embodiment, the diffraction grating pattern may be formed in the second resist layer 22 by proximity exposure, by employing the optical stamp 34.

Figure 12:
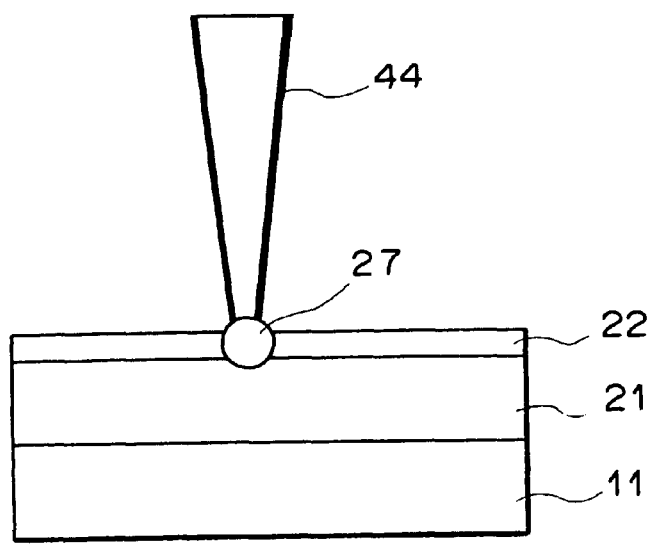
FIG. 12 is a sectional view showing the condition of near-field light in a fifth embodiment of the present invention.

FIG. 12 illustrates a fifth embodiment of the present invention. In the fifth embodiment, scanning exposure employing a probe 44 is applied. This probe 44 has an opening of smaller diameter than the wavelength of illuminating light and emits near-field light. The probe 44 is driven by scanning means (not shown) so that it scans on the second resist layer 22 according to the diffraction grating pattern. In this way, the diffraction grating pattern is formed in the second resist layer 22.

Figure 13:
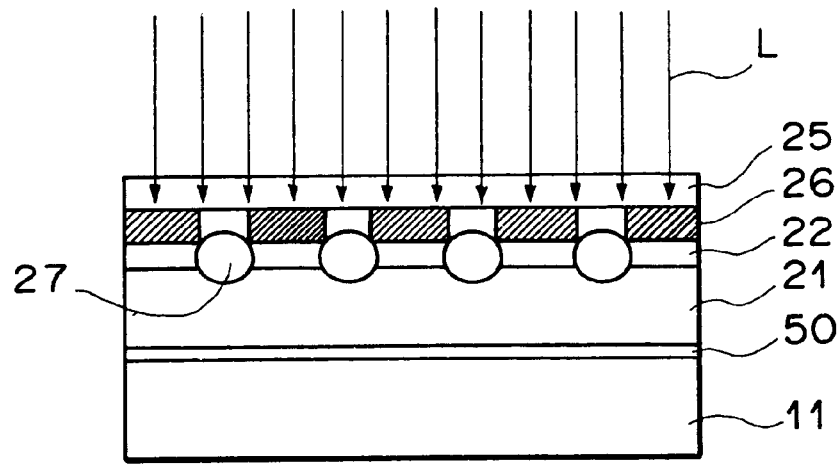
FIG. 13 is a sectional view showing the condition of near-field light in a sixth embodiment of the present invention.

FIG. 13 illustrates a sixth embodiment of the present invention. This sixth embodiment employs resist layer construction provided with an antireflection film 50 between a first resist layer 21 and a GaN optical waveguide layer 11. As the depth that near-field light 27 is emitted has about tens of nm, there is little possibility of reflected light. However, if the antireflection film 50 is formed in this manner, scattered light can be reliably prevented from leaking out to the lower surface side of the GaN optical waveguide layer 11.

Figure 14:
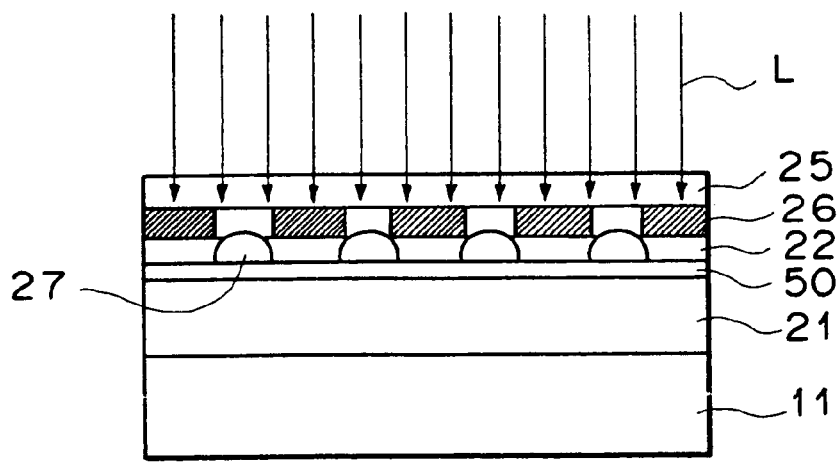
FIG. 14 is a sectional view showing the condition of near-field light in a seventh embodiment of the present invention.

FIG. 14 illustrates a seventh embodiment of the present invention. This seventh embodiment employs a resist layer construction provided with an antireflection film 50 between a first resist layer 21 and a second resist layer 22. Even if done in this manner, the same effect as the sixth embodiment can be obtained.

Next, the first and second resist layers in the present invention will be described in detail.

The first resist layer 21 is formed from material to which dry etching can be applied, particularly an organic polymer material. It is desirable not to form an intervening mixed layer between the first resist layer 21 and the second resist layer 22. For this reason, it is preferable that the organic polymer material of the first resist layer 21 employ material which does not dissolve into the solvent in the second resist layer 22, or material which dissolves at the normal temperature but, by a process such as a heating process, is bridged in mesh form and does not substantially form an intervening mixed layer.

As an example of the latter, there is a method of coating an i-ray or g-ray resist film to the required film thickness and then hardening the resist film by a heating process, the resist film containing both novolak resin and a naphthoquinonediazido compound and also being employed in semiconductor device fabrication, etc. There is another method of coating a negative resist film and then hardening the resist film by exposing the entire surface, the resist film containing alkali soluble resin, such as novolak resin and polyhydroxystyrene, an acid bridging agent, and an optical acid-generating agent. There is still another method of coating a negative resist film and then hardening the resist film by entire-surface exposure or a heating process, the resist film containing alkali soluble resin, such as novolak resin and polyhydroxystyrene, a multifunctional monomer, and a photopolymerization or thermopolymerization initiator.

The first resist layer 21 may be mixed with additives (e.g., fullerene and its derivatives) with various objects.

The second resist layer 22 employs a photosensitive resist material in which either exposed regions or unexposed regions by emission of near-field light become soluble in a developing solvent and the remaining region has resistance to dry etching. It is preferable that the resist material contain a compound having silicon atoms and that the silicon content in the solid component be a fixed value or greater. In the case where dry etching is executed by oxygen-contained plasma, a higher silicon content is preferred from the standpoint of resistance to oxygen and plasma. However, usually, if the silicon content is too high, pattern formability, edge roughness of the remainder or pattern, etc., become worse. Therefore, the silicon content is 1% or higher, preferably between 4% and 5%. Particularly, a range between 3% and 5% is preferred.

As the resist material employed in the second resist layer 22 of the present invention, there are resist materials described in Japanese Patent Nos. 2035509, 2094657, 2597163, 2606652, 2646241, 2646288, and 2646289, Japanese Unexamined Patent Publication Nos. 60(1985)-191245, 62(1987)-247350, 62(1987)-36661, 62(1987)-36662, 62(1987)-38452, 62(1987)-96526, 62(1987)-136638, 62(1987)-153383, 62(1987)-159141, 62(1987)-220949, 62(1987)-229136, 62(1987)-240954, 63(1988)-91654, 63(1988)-195649, 63(1988)-195650, 63(1988)-218948, 63(1988)-220241, 63(1988)-220242, 63(1988)-241542, 63(1988)-239440, and 63(1988)-313149, Japanese Unexamined Patent Publication Nos. 1(1989)-44933, 1(1989)-46746, 1(1989)-46747, 1(1989)-76046, 1(1989)-

106042, 1(1989)-102550, 1(1989)-142720, 1(1989)-201653, 1(1989)-222254, 1(1989)283555, 2(1990)-29652, 2(1990)-3054, 2(1990)-99954, 3(1991)-100553, 4(1992)-36754, 4(1992)-36755, 4(1992)-104252, 4(1992)-106549, 4(1992)-107460, 4(1992)-107562, 4(1992)-130324, 4(1992)-245248, 6(1994)-27670, 6(1994)-118651, 6(1994)-184311, 6(1994)-27671, 6(1994)-35199, 6(1994)-43655, 6(1994)-95385, 6(1994)-202338, 6(1994)-342209, 7(1995)-114188, 8(1996)-29987, 8(1996)-160620, 8(1996)-160621, 8(1996)-160623, 8(1996)-193167, and 10(1998)-319594, Japanese Patent Publication Nos. 6(1994)-7259, 6(1994)-42075, 6(1994)-56492, 6(1994)-79160, 6(1994)-84432, 7(1995)-27211, 7(1995)-60266, 7(1995)-69610, 7(1995)-99435, 7(1995)-111582, and 7(1995)-113772, U.S. Pat. Nos. 4,689,289 and 4,822,716, EP No. 229629A1, and Japanese Patent Application Nos. 10(1998)-354878, 11(1999)-31591, and 11(1999)-20224, and so on.

The materials developable with a water alkali developing solution, among the aforementioned materials, are preferred because they have no organic waste fluid, less swelling, and high resolution and are capable of forming satisfactory patterns. Specifically, the preferred materials are pattern forming materials which contain both a silicon-containing polymer insoluble in water and soluble in water alkali and a photosensitive compound.

More specifically, there are the following materials: (1) pattern forming material which contains (a) a silicon-containing polymer insoluble in water and soluble in water alkali, (b) a naphthoquinonediazido compound and/or (c) a diazoketone compound; (2) positive pattern forming material which contains (a) a silicon-containing polymer insoluble in water and soluble in water alkali, (b) a compound which generates an acid by irradiation of active light or radiation, and (c) a high or low molecular compound having a group resoluble by an acid and also having the property of increasing the solubility in a water alkali developing solution by action of an acid; (3) negative pattern forming material which contains (a) a water-insoluble silicon-containing polymer having a group resoluble by an acid and also having a functional group in which the solubility in a water alkali developing solution increases by action of an acid, (b) a compound which generates an acid by irradiation of active light or radiation, and (c) a high or low molecular compound having a group bridgeable by an acid and also having the property of decreasing the solubility in a water alkali developing solution by action of an acid; (4) negative pattern forming material which contains (a) a water-insoluble silicon-containing polymer having an olefin unsaturated group and also having the property of decreasing the solubility in a water alkali developing solution by a polymerization reaction and (b) a compound having ability to initiate a polymerization reaction by irradiation of active light or radiation; (5) negative pattern forming material which contains (a) a silicon-containing polymer insoluble in water and soluble in water alkali, (b) a compound having ability to initiate a polymerization reaction by irradiation of active light or radiation, and (c) a high or low molecular compound having an olefin unsaturated group and also having the property of decreasing the solubility in a water alkali developing solution by a polymerization reaction; and so on.

The positive pattern forming material (2), among the aforementioned materials, is preferred which contains (a) a silicon-containing polymer insoluble in water and soluble in water alkali, (b) a compound which generates an acid by irradiation of active light or radiation, and (c) a high or low molecular compound having a group resoluble by an acid and also having the property of increasing the solubility in a water alkali developing solution by action of an acid. For such a pattern forming material, the general formula, description, and specific examples are set forth in detail in the aforementioned Japanese Unexamined Patent Application No. 10(1998)-354878. Similar material can also be satisfactorily employed in the present invention. Similarly, various additives which can be added to this pattern forming material are explained in detail in the aforementioned Japanese Unexamined Patent Application No. 10(1998)-354878. Similar additives can be satisfactorily employed in the present invention.

In the aforementioned embodiments it has been described and illustrated that the first resist layer, removable by etching, and the second resist layer, in which either the exposed regions or the unexposed regions become soluble in the developing solution, are formed on the base material and the second resist layer is exposed to near-field light. However, it is also possible to form a diffraction grating on the base material, by forming a single resist layer similar to the second resist layer on the base material, exposing this resist layer to near-field light and then developing the exposed resist layer to form a diffraction grating pattern, and etching the base material with the pattern as a mask.

In addition, the present invention is applicable not only to the case of fabricating a diffraction grating for a DFB laser but also to the case of fabricating a diffraction grating which is provided in devices other than semiconductor lasers.

While the present invention has been described with reference to the preferred embodiments thereof, the invention is not limited to the details given herein, but may be modified within the scope of the appended claims.

What is claimed is:

1. A diffraction-grating fabricating method comprising the steps of:
    forming a photosensitive resist layer on a base material, either exposed or unexposed regions of said resist layer by emission of light becoming soluble in a developing solvent;
    emitting near-field light to said resist layer to form a diffraction grating pattern upon reception of said light;
    forming said diffraction grating pattern in said resist layer by developing said resist layer; and
    forming a diffraction grating in said base material by etching said base material with said pattern in said resist layer as an etching mask.

2. A diffraction-grating fabricating method comprising the steps of:
    forming a first resist layer and a second resist layer on a base material in the recited order, said first resist layer being removable by etching and said second resist layer being a photosensitive resist layer in which either exposed or unexposed regions by emission of light become soluble in a developing solvent;
    emitting near-field light to said second resist layer to form a diffraction grating pattern upon reception of said light;
    forming said diffraction grating pattern in said second resist layer by developing said second resist layer;
    etching said first resist layer with said pattern in said second resist layer as an etching mask and forming a diffraction grating pattern consisting of said first and second resist layers; and
    forming a diffraction grating in said base material by etching said base material with said pattern in said first and second resist layers as an etching mask.

3. The diffraction-grating fabricating method as set forth in claim 2, wherein said second resist layer is formed to a thickness of 100 nm or less.

4. The diffraction-grating fabricating method as set forth in claim 2, wherein said first resist layer is formed from non-photosensitive material and said step of etching said first resist layer is performed by dry etching.

5. The diffraction-grating fabricating method as set forth in claim 3, wherein said first resist layer is formed from non-photosensitive material and said step of etching said first resist layer is performed by dry etching.

6. The diffraction-grating fabricating method as set forth in claim 1, wherein said light has a wavelength of 250 to 450 nm and said diffraction grating has a cycle of 400 nm or less.

7. The diffraction-grating fabricating method as set forth in claim 2, wherein said light has a wavelength of 250 to 450 nm and said diffraction grating has a cycle of 400 nm or less.

8. The diffraction-grating fabricating method as set forth in claim 3, wherein said light has a wavelength of 250 to 450 nm and said diffraction grating has a cycle of 400 nm or less.

9. The diffraction-grating fabricating method as set forth in claim 4, wherein said light has a wavelength of 250 to 450 nm and said diffraction grating has a cycle of 400 nm or less.

10. The diffraction-grating fabricating method as set forth in claim 1, wherein said diffraction grating is formed so that it is rectangular in cross section.

11. The diffraction-grating fabricating method as set forth in claim 2, wherein said diffraction grating is formed so that it is rectangular in cross section.

12. The diffraction-grating fabricating method as set forth in claim 3, wherein said diffraction grating is formed so that it is rectangular in cross section.

13. The diffraction-grating fabricating method as set forth in claim 4, wherein said diffraction grating is formed so that it is rectangular in cross section.

14. The diffraction-grating fabricating method as set forth in claim 6, wherein said diffraction grating is formed so that it is rectangular in cross section.

15. The diffraction-grating fabricating method as set forth in claim 1, wherein said diffraction grating is formed so that its line-and-space ratio is between 1.2:1 and 1:1.2.

16. The diffraction-grating fabricating method as set forth in claim 2, wherein said diffraction grating is formed so that its line-and-space ratio is between 1.2:1 and 1:1.2.

17. The diffraction-grating fabricating method as set forth in claim 3, wherein said diffraction grating is formed so that its line-and-space ratio is between 1.2:1 and 1:1.2.

18. The diffraction-grating fabricating method as set forth in claim 4, wherein said diffraction grating is formed so that its line-and-space ratio is between 1.2:1 and 1:1.2.

19. The diffraction-grating fabricating method as set forth in claim 6, wherein said diffraction grating is formed so that its line-and-space ratio is between 1.2:1 and 1:1.2.

20. The diffraction-grating fabricating method as set forth in claim 10, wherein said diffraction grating is formed so that its line-and-space ratio is between 1.2:1 and 1:1.2.

21. The diffraction-grating fabricating method as set forth in claim 1, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where near-field light reaches said exposed resist layer.

22. The diffraction-grating fabricating method as set forth in claim 2, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where near-field light reaches said exposed resist layer.

23. The diffraction-grating fabricating method as set forth in claim 3, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where said near-field light reaches said exposed resist layer.

24. The diffraction-grating fabricating method as set forth in claim 4, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where said near-field light reaches said exposed resist layer.

25. The diffraction-grating fabricating method as set forth in claim 6, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where said near-field light reaches said exposed resist layer.

26. The diffraction-grating fabricating method as set forth in claim 10, wherein the step of emitting near-field light is performed through a mask, formed above a member permeable to said light, which emits said near-field light from a metal pattern having openings; and said light emission is performed with said metal pattern disposed in direct contact with the exposed resist layer formed on said base material, or in close proximity to said exposed resist layer in a range where said near-field light reaches said exposed resist layer.

27. The diffraction-grating fabricating method as set forth in claim 1, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

28. The diffraction-grating fabricating method as set forth in claim 2, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

29. The diffraction-grating fabricating method as set forth in claim 3, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

30. The diffraction-grating fabricating method as set forth in claim 4, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

31. The diffraction-grating fabricating method as set forth in claim 6, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

32. The diffraction-grating fabricating method as set forth in claim 10, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

33. The diffraction-grating fabricating method as set forth in claim 15, wherein the step of emitting near-field light is performed by an optical stamp formed from a member permeable to said light, a land-and-groove pattern being formed on one surface of said member and said optical stamp emitting near-field light according to said land-and-groove pattern when said light is guided through the inside of said member to said one surface and totally reflected at said one surface; and said light emission is performed with said optical stamp disposed in direct contact with the exposed resist layer formed on said base material, or in close proximity to said exposed resist layer in a range where said near-field light reaches said exposed resist layer.

34. The diffraction-grating fabricating method as set forth in claim 1, wherein the step of emitting near-field light is performed by a probe with an opening of smaller diameter than a wavelength of said light; and said light emission is performed by scanning said probe on the exposed resist layer formed on said base material.

35. The diffraction-grating fabricating method as set forth in claim 2, wherein the step of emitting near-field light is performed by a probe with an opening of smaller diameter than a wavelength of said light; and said light emission is performed by scanning said probe on the exposed resist layer formed on said base material.

36. The diffraction-grating fabricating method as set forth in claim 3, wherein the step of emitting near-field light is performed by a probe with an opening of smaller diameter than a wavelength of said light; and said light emission is performed by scanning said probe on the exposed resist layer formed on said base material.

37. The diffraction-grating fabricating method as set forth in claim 4, wherein the step of emitting near-field light is performed by a probe with an opening of smaller diameter than a wavelength of said light; and said light emission is performed by scanning said probe on the exposed resist layer formed on said base material.

38. The diffraction-grating fabricating method as set forth in claim 6, wherein the step of emitting near-field light is performed by a probe with an opening of smaller diameter than a wavelength of said light; and said light emission is performed by scanning said probe on the exposed resist layer formed on said base material.

39. The diffraction-grating fabricating method as set forth in claim 10, wherein the step of emitting near-field light is performed by a probe with an opening of smaller diameter than a wavelength of said light; and said light emission is performed by scanning said probe on the exposed resist layer formed on said base material.

40. The diffraction-grating fabricating method as set forth in claim 15, wherein the step of emitting near-field light is performed by a probe with an opening of smaller diameter than a wavelength of said light; and said light emission is performed by scanning said probe on the exposed resist layer formed on said base material.

41. The diffraction-grating fabricating method as set forth in claim 1, wherein said diffraction grating is fabricated for a distributed feedback (DFB) laser or distributed Bragg reflector (DBR) laser.

42. The diffraction-grating fabricating method as set forth in claim 2, wherein said diffraction grating is fabricated for a distributed feedback (DFB) laser or distributed Bragg reflector (DBR) laser.

43. The diffraction-grating fabricating method as set forth in claim 3, wherein said diffraction grating is fabricated for a distributed feedback (DFB) laser or distributed Bragg reflector (DBR) laser.

44. The diffraction-grating fabricating method as set forth in claim 4, wherein said diffraction grating is fabricated for a distributed feedback (DFB) laser or distributed Bragg reflector (DBR) laser.

45. The diffraction-grating fabricating method as set forth in claim 6, wherein said diffraction grating is fabricated for a distributed feedback (DFB) laser or distributed Bragg reflector (DBR) laser.

46. The diffraction-grating fabricating method as set forth in claim 10, wherein said diffraction grating is fabricated for a distributed feedback (DFB) laser or distributed Bragg reflector (DBR) laser.

47. The diffraction-grating fabricating method as set forth in claim 15, wherein said diffraction grating is fabricated for a distributed feedback (DFB) laser or distributed Bragg reflector (DBR) laser.

48. The diffraction-grating fabricating method as set forth in claim 21, wherein said diffraction grating is fabricated for a distributed feedback (DFB) laser or distributed Bragg reflector (DBR) laser.

49. The diffraction-grating fabricating method as set forth in claim 28, wherein said diffraction grating is fabricated for a distributed feedback (DFB) laser or distributed Bragg reflector (DBR) laser.

50. The diffraction-grating fabricating method as set forth in claim 35, wherein said diffraction grating is fabricated for a distributed feedback (DFB) laser or distributed Bragg reflector (DBR) laser.

\* \* \* \* \*